(12) United States Patent
Kuan et al.

(10) Patent No.: US 11,562,963 B2
(45) Date of Patent: Jan. 24, 2023

(54) STACKED SEMICONDUCTOR PACKAGE AND METHOD OF FORMING THE SAME

(71) Applicant: Intel Corporation, Santa Clara, CA (US)

(72) Inventors: Chin Lee Kuan, Bentong Pahang (MY); Bok Eng Cheah, Gelugor Pulau Pinang (MY); Jackson Chung Peng Kong, Tanjung Tokong Pulau Pinang (MY); Sameer Shekhar, Portland, OR (US); Amit Jain, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 50 days.

(21) Appl. No.: 16/987,440

(22) Filed: Aug. 7, 2020

(65) Prior Publication Data

US 2021/0384135 A1 Dec. 9, 2021

(30) Foreign Application Priority Data

Jun. 5, 2020 (MY) .............................. PI2020002905

(51) Int. Cl.
*H01L 23/538* (2006.01)
*H01L 23/00* (2006.01)
*H01L 21/48* (2006.01)

(52) U.S. Cl.
CPC ........ *H01L 23/5386* (2013.01); *H01L 21/486* (2013.01); *H01L 21/4853* (2013.01);
(Continued)

(58) Field of Classification Search
CPC ......... H01L 45/085; H01L 45/12–1253; H01L 45/1266–14; H01L 45/145–1691; H01L 23/49827; H01L 23/5384; H01L 23/5389; H01L 23/49811; H01L 23/16–26; H01L 2224/16155–16168; H01L 2224/16225–1624; H01L 2224/24155; H01L 2224/24225–24227;
(Continued)

(56) References Cited

U.S. PATENT DOCUMENTS 9,651,751 B1 * 5/2017 Ding .................... G02B 6/4245
10,211,158 B2 * 2/2019 Hohlfeld ................. H01L 25/00
(Continued)

*Primary Examiner* — Monica D Harrison
*Assistant Examiner* — Lawrence C Tynes, Jr.
(74) *Attorney, Agent, or Firm* — Viering, Jentschura & Partner mbB

(57) ABSTRACT

According to various examples, a stacked semiconductor package is described. The stacked semiconductor package may include a package substrate. The stacked semiconductor package may also include a base die disposed on and electrically coupled to the package substrate. The stacked semiconductor package may further include a mold portion disposed on the package substrate at a periphery of the base die, the mold portion may include a through-mold interconnect electrically coupled to the package substrate. The stacked semiconductor package may further include a semiconductor device having a first section disposed on the base die and a second section disposed on the mold portion, wherein the second section of the semiconductor device may be electrically coupled to the package substrate through the through-mold interconnect.

14 Claims, 7 Drawing Sheets

(52) U.S. Cl.
CPC ...... *H01L 21/4857* (2013.01); *H01L 23/5383* (2013.01); *H01L 23/5384* (2013.01); *H01L 24/16* (2013.01); *H01L 2224/16227* (2013.01)

(58) Field of Classification Search
CPC .................. H01L 2224/32155–32168; H01L 2224/32225–3224; H01L 2224/29025; H01L 2224/29009; H01L 2224/16146; H01L 2224/13025; H01L 2224/13009; H01L 2224/08146; H01L 2224/0557; H01L 2224/0509; H01L 2224/05087; H01L 2224/05025; H01L 2224/05009; H01L 2224/02372; H01L 2225/06548; H01L 21/76898; G11C 11/5614; G11C 13/0011

See application file for complete search history.

(56) References Cited

U.S. PATENT DOCUMENTS

| | | | |
|---|---|---|---|
| 2014/0353827 A1* | 12/2014 | Liu | H01L 23/5386 257/751 |
| 2017/0365580 A1* | 12/2017 | Shih | H01L 24/14 |
| 2017/0373037 A1* | 12/2017 | Yu | H01L 23/3677 |
| 2018/0269143 A1* | 9/2018 | Adams | H01L 23/535 |
| 2019/0304912 A1* | 10/2019 | Ecton | H01L 23/5383 |
| 2020/0381345 A1* | 12/2020 | Chang | H01L 25/115 |
| 2021/0091005 A1* | 3/2021 | Tsai | H01L 24/05 |
| 2021/0351145 A1* | 11/2021 | Patil | H01L 24/19 |

\* cited by examiner

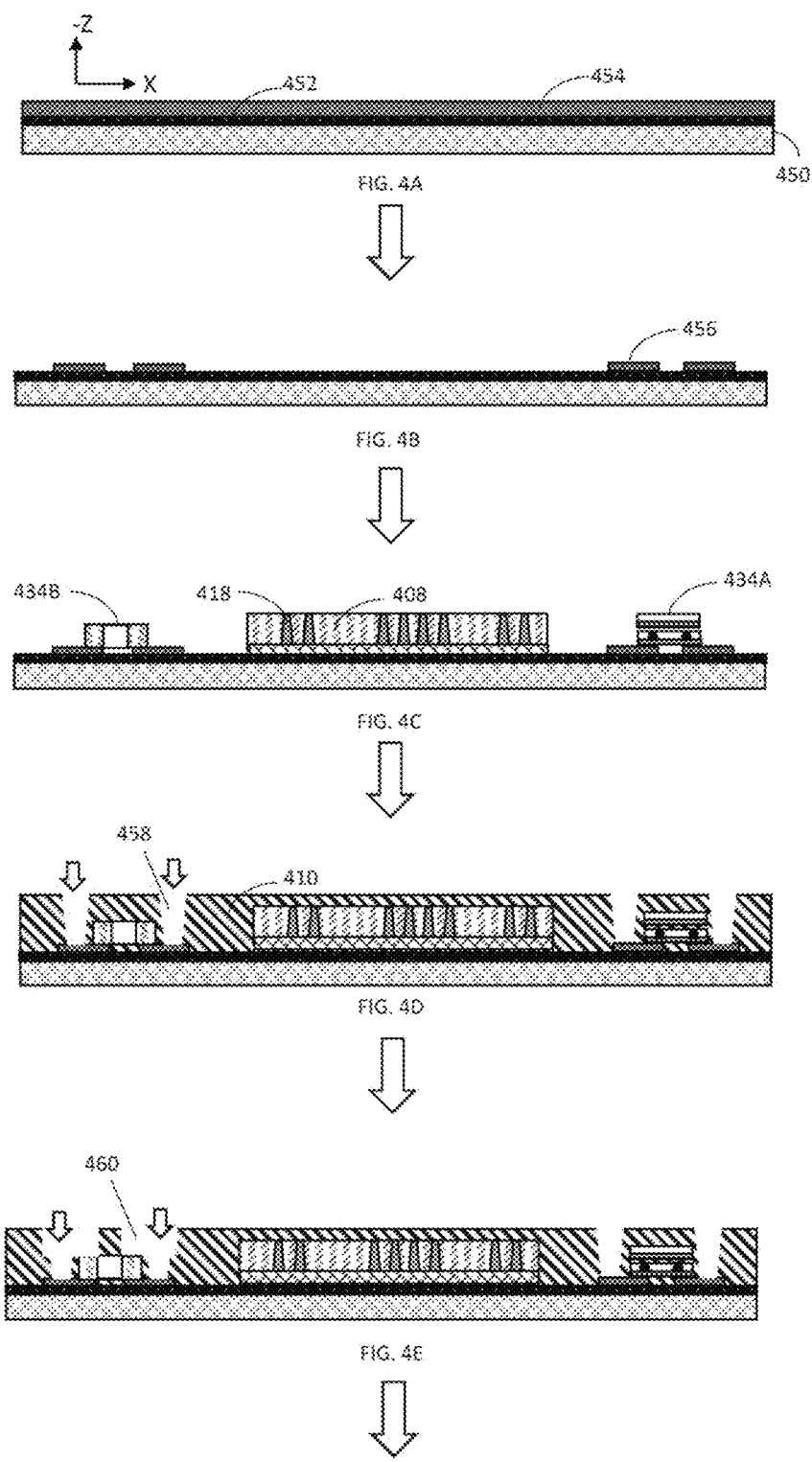

STACKED SEMICONDUCTOR PACKAGE AND METHOD OF FORMING THE SAME

CROSS-REFERENCE TO RELATED APPLICATIONS

This application claims priority to Malaysian Patent Application PI2020002905, which was filed on Jun. 5, 2020, the entire contents of which are hereby incorporated herein by reference.

BACKGROUND

In order to improve input/output (JO) bandwidths, or for system miniaturization, a die stacking packaging process technology designed to incorporate 2 or more chiplets assembled together may be used. However, this may result in top die power integrity (PI) performance (e.g. Fmax and Vmin) limitations due to additional IR drop losses across base die routing, and the through-silicon vias (TSVs) interconnects. There may also be top die PI performance limitations due to increased distance between circuit blocks and package/board capacitors leading to higher alternating current (AC) noise coupling, and/or maximum current (Imax) constraints driven by base die current carrying capability. Further, there may be an increase in base die footprint to house multiple chiplets which may lead to added silicon bill of material (BOM) costs, package warpage concerns and potentially higher die assembly yield losses. There may also be base die PI performance limitations due to miniaturized trace routing and/or plane geometry between the stacked die hierarchy.

Existing solutions to address the abovementioned challenges include increase of platform voltage supply (e.g. from 0.9V to 1.1V) to ensure performance, reduction of silicon ICCMax threshold to avoid reliability risk, increase of metal-insulator-metal (MIM) capacitance on chiplets to suppress power delivery network peak impedance (ZPDN), and increase of package substrate thickness to mitigate warpage risk.

However, these existing solutions increase device power consumptions, result in electrical performance degradation e.g., reduction of maximum frequency (Fmax) threshold and/or increase device form factor.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIGS. 4A through 4I show cross-sectional views directed to an exemplary process flow for a method of forming a stacked semiconductor package according to an aspect of the present disclosure;

DETAILED DESCRIPTION

Figure 1:
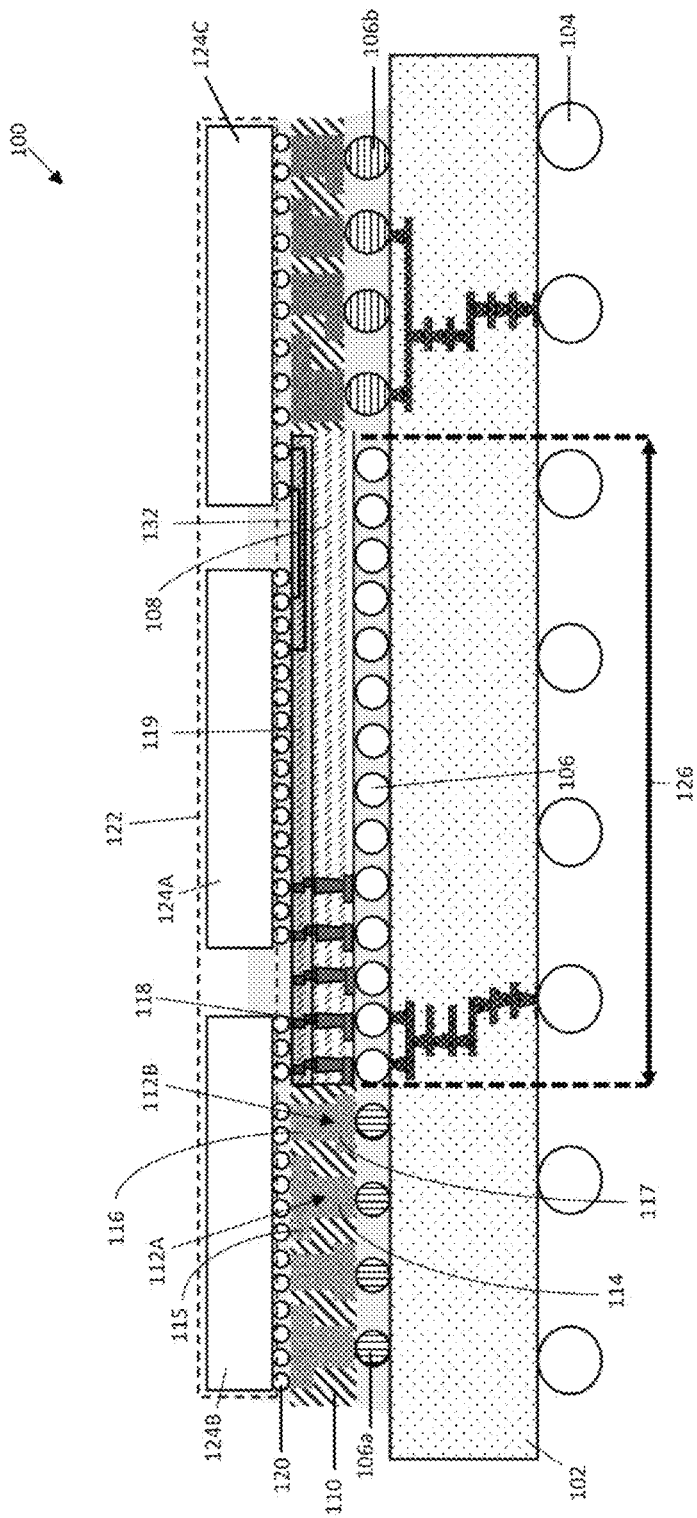
FIG. 1 shows a cross-sectional view of a stacked semiconductor package according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for stacked semiconductor packages, and various aspects are provided for methods. It will be understood that the basic properties of the stacked semiconductor packages also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

An advantage of the present disclosure may include mitigation of direct current (DC) and AC losses (Vmin and LL3 impedance reduction). This may contribute to computing core and/or graphics Fmax performance gain.

Another advantage of the present disclosure may include improved power integrity through PDN parasitic impedance reduction. This may result in a lower power supply voltage threshold, which may result in the minimization of device power consumptions.

Another advantage of the present disclosure may include increased Imax capacity through the configurable embedded interconnect with increased interconnect geometries (circumventing geometry constraints through the base die). This may improve device reliability, and computing performance.

Another advantage of the present disclosure may include reduction of base die footprint which may result in improved package warpage.

The present disclosure generally relates to a device. The device may include a package substrate. The device may also include a base die on and electrically coupled to the package substrate. The device may further include a mold portion on the package substrate at a periphery of the base die, the mold portion may include a through-mold interconnect electrically coupled to the package substrate. The device may further include a semiconductor device having a first section disposed on the base die, and a second section disposed on the mold portion, wherein the second section of the semiconductor device may be electrically coupled to the package substrate through the through-mold interconnect.

The present disclosure generally relates to a method of forming a stacked semiconductor package. The method may include forming a package substrate, forming an interposer, and forming a mold portion at a periphery of the interposer. The method may also include forming a through-mold interconnect in the mold portion, forming a semiconductor device, and disposing a first section of the semiconductor device on the interposer, and a second section on the through-mold interconnect on the mold portion. The method may further include disposing the interposer, the mold portion, and the semiconductor device on the package substrate, wherein the second section of the semiconductor device may be electrically coupled to the package substrate through the through-mold interconnect.

The present disclosure generally relates to a computing device. The computing device may include a circuit board, and a stacked semiconductor package coupled with the circuit board. The stacked semiconductor package may include a package substrate. The stacked semiconductor package may also include a base die on and electrically coupled to the package substrate. The stacked semiconductor package may further include a mold portion on the package substrate at a periphery of the base die, the mold portion may include a through-mold interconnect electrically coupled to the package substrate. The stacked semiconductor package may further include a semiconductor device having a first section disposed on the base die, and a second section disposed on the mold portion, wherein the second section of the semiconductor device may be electrically coupled to the package substrate through the through-mold interconnect.

To more readily understand and put into practical effect, the present semiconductor packages, system, method, and other particular aspects will now be described by way of examples and not limitations, and with reference to the figures. For the sake of brevity, duplicate descriptions of features and properties may be omitted.

FIG. 1 shows a cross-sectional view of a stacked semiconductor package according to an aspect of the present disclosure.

In the aspect shown in FIG. 1, the stacked semiconductor package 100 may include a package substrate 102. The package substrate 102 may include contact pads, electrical interconnects, routings, and other features, which are not shown in any of the present figures. The package substrate 102 may have one or more rigid core layer for improved structural stability or a coreless substrate package for a reduced form-factor. In other aspects, the package substrate 102 may be part of a larger substrate that supports additional semiconductor packages, and/or components.

In an aspect, the stacked semiconductor package 100 may include a plurality of solder balls 104. The package substrate 102 may be connected to a motherboard through the plurality of solder balls 104. The plurality of solder balls 104 may also provide an electrical connection between the package substrate 102, and the motherboard. In an aspect, the stacked semiconductor package 100 may include a plurality of package bumps 106 disposed on the package substrate 102. The plurality of package bumps 106 may be controlled collapse chip connection (C4) bumps.

In an aspect of the present disclosure, the stacked semiconductor package 100 may include a base die 108. The base die 108 may be an active interposer, or a passive interposer. In an aspect, the base die 108 may be disposed on the package substrate 102. In an aspect, the base die 108 may be connected to the package substrate 102 through the plurality of package bumps 106. The plurality of package bumps 106 may also provide an electrical connection between the base die 108, and the package substrate 102.

In an aspect of the present disclosure, the base die 108 may include at least one through-silicon via (TSV) 118. The plurality of package bumps 106 may provide an electrical connection between the at least one TSV 118, and the package substrate 102.

In an aspect of the present disclosure, the stacked semiconductor package 100 may include a mold portion 110. In an aspect, the mold portion 110 may be disposed on the package substrate 102. In an aspect, the mold portion 110 may be connected to the package substrate 102 through a plurality of package bumps 106a and/or 106b. In an aspect, the mold portion 110 may be disposed at a periphery of the base die 108.

In an aspect of the present disclosure, the mold portion 110 may be the same height as the base die 108. In various aspects, the base die 108 may include a first height. The mold portion 110 may include a first section with the first height. The plurality of package bumps 106a coupled to the first section of the mold portion 110 may be the same size as the plurality of package bumps 106 coupled to the base die 108. In an aspect, the mold portion 110 may also include a second section with a second height lesser than the first height to facilitate the plurality of package bumps 106b coupled to the mold portion 110. The plurality of package bumps 106b may have larger geometry compared to the plurality of package bumps 106 coupled to the base die 108.

In an aspect of the present disclosure, the mold portion 110 may include at least one through-mold interconnect (TMI) 112. In an aspect, the mold portion 110 may include a molding material such as epoxy resin polymer, silicone polymer or polyimide material. The mold portion 110 may have a first mold surface coupled to the package substrate 102. The mold portion 110 may have a second mold surface coupled to the semiconductor device 122. In an aspect, the at least one through-mold interconnect (TMI) 112 may be embedded in the molding material of the mold portion 110. The at least one through-mold interconnect (TMI) 112 may extend through the first mold surface, and the second mold surface.

In an aspect of the present disclosure, the plurality of package bumps 106a and/or 106b may provide an electrical connection between the at least one TMI 112, and the package substrate 102.

In an aspect of the present disclosure, the semiconductor package 100 may include a semiconductor device 122. In an aspect, the semiconductor device 122 may be made from any suitable semiconductor, such as, silicon or gallium arsenide. The semiconductor device 122 may be a semiconductor die, chip or a set of chiplets, e.g., a system-on-chip (SOC), a platform controller hub (PCH)/chipset, a memory device, a field programmable gate array (FPGA) device, a central processing unit (CPU), or a graphic processing unit (GPU). In the aspect shown in FIG. 1, the semiconductor device 122 is a set of chiplets, which may include SOC 124A, CPU 124B, and GPU 124C.

In an aspect of the present disclosure, the semiconductor device 122 may be at least partially disposed on the base die 108. The semiconductor device 122 may also be at least partially disposed on the mold portion 110. In an aspect, the semiconductor device 122 may have a first section disposed on the base die 108. The semiconductor device 122 may have a second section disposed on the mold portion 110. As shown in FIG. 1, the SOC 124A of the semiconductor device 122 may be disposed on the base die 108. The CPU 124B of the semiconductor device 122 may be partially disposed on the base die 108, and may be partially disposed on the mold portion 110. The GPU 124C of the semiconductor device 122 may be partially disposed on the base die 108, and may be partially disposed on the mold portion 110.

In an aspect of the present disclosure, at least a portion of the semiconductor device 122 may be electrically coupled to the package substrate 102 through the at least one TSV 118.

In an aspect, at least a portion of the semiconductor device 122 may be electrically coupled to the package substrate 102 through the at least one TMI 112. In an aspect, the at least one TMI 112 may be configurable. The at least one TMI 112 may be configured based on the power delivery requirements of the stacked semiconductor package 100, to mitigate power delivery challenges for 2.5D and/or 3D stacked integrated circuit (IC) packaging architectures. For example, a size, width, and/or volume of the at least one TMI 112 may be configured to meet the power delivery requirements.

In an aspect of the present disclosure, the at least one TMI 112 may include a first TMI 112A. In an aspect, the first TMI 112A may include a first portion 114, and a second portion 115. In an aspect, the first portion 114 may be coupled to the package substrate 102. The second portion 115 may be coupled to the semiconductor device 122.

In an aspect of the present disclosure, the first portion 114, and the second portion 115 may have different widths. The first portion 114 may have a width of a first dimension. The second portion 115 may have a width of a second dimension. In an aspect, the second dimension larger than the first dimension. In other words, the first portion 114 may have a smaller width than the second portion 115. The first dimension may include a width geometry ranging from approximately 100 micrometers (μm) to 300 μm. The second dimension may include a width geometry ranging from approximately 2 to 3 times of the first dimension.

In an aspect, the first TMI 112A may be configured as a power supply reference voltage (Vcc) connection between the package substrate 102 and the semiconductor device 122. The power supply reference voltage (Vcc) may be approximately 1.0 volt (V). In various aspects, the power supply reference voltage (Vcc) may be approximately between 1.0 V to 3.3 V.

In an aspect, the first portion 114, and the second portion 115 may have dimensions that provide substantially similar volumes in a way that the resistance difference between the first portion 114, and the second portion 115 may be minimized.

In an aspect of the present disclosure, the at least one TMI 112 may include a second TMI 112B. In an aspect, the second TMI 112B may include a third portion 116, and a fourth portion 117. In an aspect, the third portion 116 may be coupled to the semiconductor device 122. The fourth portion 117 may be coupled to the package substrate 102.

In an aspect of the present disclosure, the third portion 116, and a fourth portion 117 may have different widths. The third portion 116 may have a width of a third dimension. The fourth portion 117 may have a width of a fourth dimension. In an aspect, the third dimension may be smaller than the fourth dimension. In other words, the fourth portion 117 may have a larger width than the third portion 116. The third dimension may include a width geometry ranging from approximately 50 micrometers (μm) to 100 μm. The fourth dimension may include a width geometry ranging from approximately 2 to 3 times of the third dimension.

In an aspect, the second TMI 112B may be configured as a ground reference voltage (Vss) connection between the package substrate 102 and the semiconductor device 122.

In an aspect, the third portion 116, and a fourth portion 117 may have dimensions that provide substantially similar volumes or may be configured in a manner that facilitates a constant spacing between the first and second TMIs 112A and 112B to achieve constant mutual inductance across the first and second mold surfaces of the mold portion 110.

In an aspect of the present disclosure, the second TMI 112B may be adjacent to the first TMI 112A. The first portion 114 may be adjacent to the fourth portion 117. The second portion 115 may be adjacent to the third portion 116.

In an aspect of the present disclosure, the first portion 114 may have the same width as the third portion 116. The second portion 115 may have the same width as the fourth portion 117. Alternatively, the first portion 114 may have the same width as the fourth portion 117, and the second portion 115 may have the same width as the third portion 116.

In an aspect of the present disclosure, a plurality of solder bumps 120 may be disposed on the mold portion 110. The plurality of solder bumps 120 may provide an electrical connection between the at least one TMI 112 and the semiconductor device 122. In an aspect, a first number of solder bumps 120 disposed on the second portion 115 may be higher than a second number of solder bumps 120 disposed on the third portion 116. For example, 4 solder bumps 120 may be disposed on the second portion 115, and 2 solder bumps 120 may be disposed on the third portion 116. In an aspect, more solder bumps 120 may be required to facilitate the power supply reference voltage (Vcc) compared to the ground reference voltage (Vss).

In an aspect of the present disclosure, the plurality of solder bumps 120 may be disposed on the base die. The plurality of solder bumps 120 may provide an electrical connection between the at least one TSV 118 and the semiconductor device 122. In an aspect, the at least one TSV 118 may be configured to transmit signals between the package substrate 102 and the semiconductor device 122.

In an aspect of the present disclosure, a width of the at least one TSV 118 may be approximately between 10 to 100 μm. In an aspect, a volume of the at least one TSV 118 may have dimensions that provide a smaller volume than a volume of the at least one TMI 112. In an aspect, the width of the at least one TSV 118 may be smaller than a width, e.g., the first to fourth dimensions, of the at least one TMI 112. The smaller width of the at least one TSV 118 may result in higher resistance in the at least one TSV 118 compared to the at least one TMI 112. Therefore, in a preferred aspect, DC voltages such as the power supply reference voltage (Vcc), and the ground reference voltage (Vss) may be facilitated by the at least one TMI 112 instead of the at least one TSV 118.

In an aspect of the present disclosure, an x-y dimension of the base die 108 is independent of an x-y dimension of the semiconductor device 122. In an aspect, a width 126 of the base die 108 may be different than a width of the semiconductor device 122, e.g., the width 126 may be smaller than the width of the semiconductor device 122. The difference in widths may be due to the mold portion 110 which may be at a periphery of the base die 108.

In an aspect of the present disclosure, the semiconductor device 122 e.g., SOC 124A, CPU 124B, and GPU 124C communicates with one another through a redistribution layer (RDL) 119 within the base die 108. In an aspect, the RDL 119 may include a plurality of conductive traces 132 interleaving with a plurality of dielectric layers. In further aspects, the RDL 119 is coupled to the at least one TSV 118 within the base die 108.

Figure 2A:
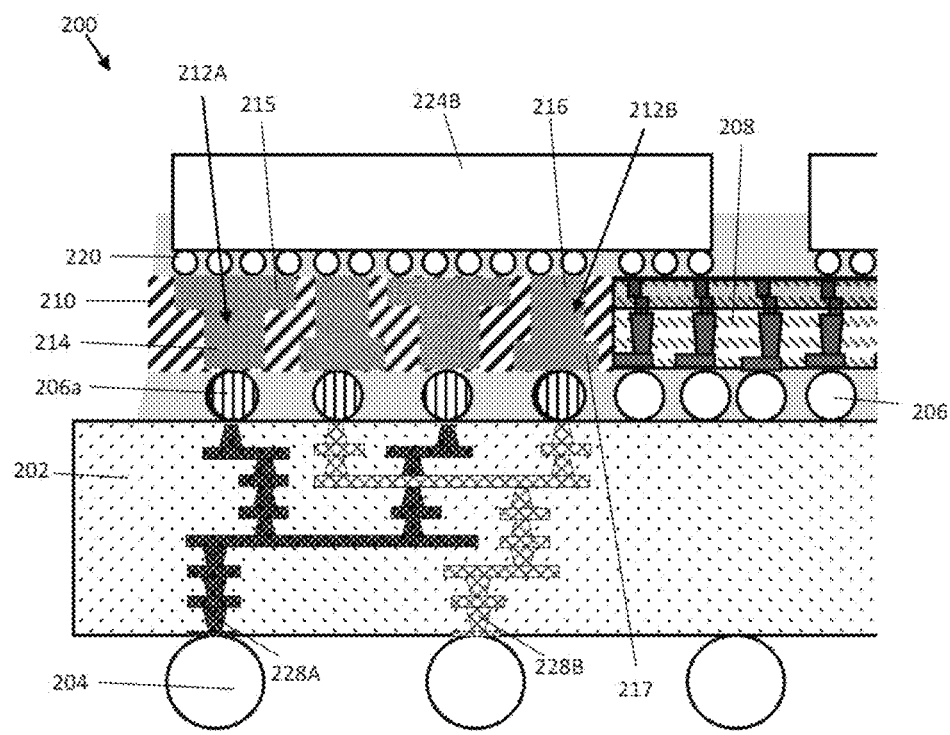
FIG. 2A shows a cross-sectional view of a stacked semiconductor package with an exemplary through-mold interconnect according to an aspect of the present disclosure.
Figure 2B:
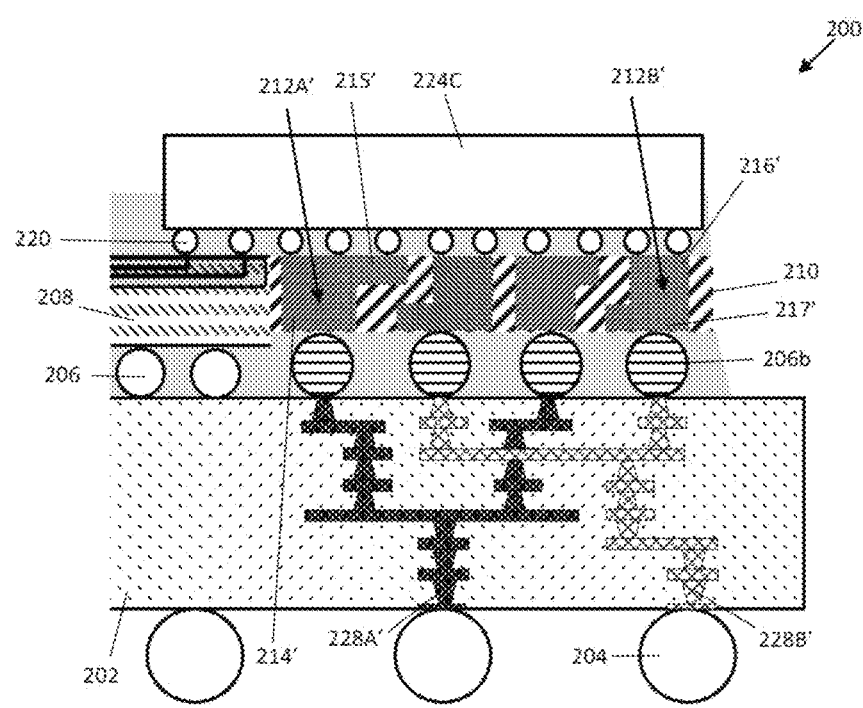
FIG. 2B shows a cross-sectional view of a stacked semiconductor package another exemplary through-mold interconnect according to an aspect of the present disclosure.

FIG. 2A shows a cross-sectional view of a stacked semiconductor package with an exemplary through-mold interconnect according to an aspect of the present disclosure. FIG. 2B shows a cross-sectional view of a stacked semiconductor package another exemplary through-mold interconnect according to an aspect of the present disclosure.

For the sake of brevity, duplicate descriptions of features and properties are omitted. It will be understood that the descriptions of any feature and/or property relating to FIG.

1 that are the same or similar to a feature and/or property in FIGS. 2A and 2B will have those descriptions be applicable here as well.

As shown in FIGS. 2A and 2B, in an aspect of the present disclosure, the stacked semiconductor package 200 may include a package substrate 202. In an aspect, the stacked semiconductor package 200 may include a plurality of solder balls 204. The package substrate 202 may be connected to a motherboard through the plurality of solder balls 204. The plurality of solder balls 204 may also provide an electrical connection between the package substrate 202, and the motherboard. In an aspect, the stacked semiconductor package 200 may include a plurality of package bumps 206, 206a and/or 206b disposed on the package substrate 202.

In an aspect of the present disclosure, the stacked semiconductor package 200 may include a base die 208. In an aspect, the base die 208 may be disposed on the package substrate 202. In an aspect, the base die 208 may be connected to the package substrate 202 through the plurality of package bumps 206. The plurality of package bumps 206 may also provide an electrical connection between the base die 208, and the package substrate 202.

In an aspect of the present disclosure, the stacked semiconductor package 200 may include a mold portion 210. In an aspect, the mold portion 210 may be disposed on the package substrate 202. In an aspect, the mold portion 210 may be connected to the package substrate 202 through the plurality of package bumps 206a and/or 206b. In an aspect, the mold portion 210 may be disposed at a periphery of the base die 208.

In an aspect of the present disclosure, the mold portion 210 may include at least one TMI 212. In an aspect, the plurality of package bumps 206a and/or 206b may provide an electrical connection between the at least one TMI 212, and the package substrate 202.

In an aspect of the present disclosure, the semiconductor package 200 may include a semiconductor device. The semiconductor device may be a set of chiplets, which may include CPU 224B, and GPU 224C. In an aspect, the CPU 224B may be disposed on the mold portion 210. In an aspect, the GPU 224C may be disposed on the mold portion 210. In an aspect, the semiconductor device may include other sections (not shown), e.g., a SOC chip, which may be disposed on the base die 208.

In an aspect, at least a portion of the semiconductor device, e.g., CPU 224B, and/or GPU 224C, may be electrically coupled to the package substrate 202 through the at least one TMI 212.

In an aspect of the present disclosure, the at least one TMI 212 may include a first TMI 212A. In an aspect, the first TMI 212A may include a first portion 214, and a second portion 215. In an aspect, the first portion 214 may be coupled to the package substrate 202. The second portion 215 may be coupled to the semiconductor device, e.g., CPU 224B, or GPU 224C.

In an aspect of the present disclosure, the first portion 214, and the second portion 215 may have different widths. The first portion 214 may have a width of a first dimension. The second portion 215 may have a width of a second dimension. In an aspect, the second dimension larger than the first dimension. In other words, the first portion 214 may have a smaller width than the second portion 215.

In an aspect of the present disclosure, the first portion 214 may have a vertical shape. In other words, a width of the first portion 214 may be smaller than a height of the first portion 214. In an aspect, the second portion 215 may have a horizontal shape. In other words, a width of the second portion 215 may be larger than a height of the second portion 215. In an aspect, the first portion 214 may aligned to a center of the second portion 215. In another aspect, the first portion 214 may aligned to offset from the center of the second portion 215, e.g., to a side of the second portion 215.

As shown in FIG. 2A, in an exemplary first TMI 212A, the first portion 214 of first TMI 212A may be center aligned with reference to the second portion 215, forming a "T" shape structure. In another exemplary first TMI 212A' shown in FIG. 2B, the first portion 214' of the first TMI 212A' may be offset from the center of the second portion 215', forming a "L" or inverted "F" shape structure.

In an aspect of the present disclosure, the first TMI 212A or 212' may be configured to facilitate a power supply reference voltage (Vcc) connection between the package substrate 202 and the semiconductor device, e.g., CPU 224B, or GPU 224C. In an aspect of the present disclosure, the first TMI 212A or 212A' may be coupled to the plurality of solder balls 204 through a plurality of metal traces and micro-vias 228A or 228A'.

In an aspect of the present disclosure, the at least one TMI 212 may include a second TMI 212B. In an aspect, the second TMI 212B may include a third portion 216, and a fourth portion 217. In an aspect, the third portion 216 may be coupled to the semiconductor device 222, e.g., CPU 224B, or GPU 224C. The fourth portion 217 may be coupled to the package substrate 202.

In an aspect of the present disclosure, the third portion 216, and a fourth portion 217 may have different widths. The third portion 216 may have a width of a third dimension. The fourth portion 217 may have a width of a fourth dimension. In an aspect, the third dimension may be smaller than the fourth dimension. In other words, the fourth portion 217 may have a larger width than the third portion 216.

In an aspect of the present disclosure, the third portion 216 may have a vertical shape. In other words, a width of the third portion 216 may be smaller than a height of the third portion 216. In an aspect, the fourth portion 217 may have a horizontal shape. In other words, a width of the fourth portion 217 may be larger than a height of the fourth portion 217. In an aspect, the third portion 216 may aligned to a center of the fourth portion 217. In another aspect, the third portion 216 may aligned to offset from the center of the fourth portion 217, e.g., to a side of the fourth portion 217.

As shown in FIG. 2A, in an exemplary second TMI 212B, the third portion 216 of the second TMI 212B may be center aligned with reference to the fourth portion 217, forming an inverted "T" shape structure. In another exemplary second TMI 212B' shown in FIG. 2B, the third portion 216' of the second TMI 212B' may be offset from the center of the fourth portion 217', forming an inverted "L" or "i" shape structure.

In an aspect of the present disclosure, the second TMI 212B or 212B' may be configured to facilitate a ground reference voltage (Vss) connection between the package substrate 202 and the semiconductor device, e.g., CPU 224B, or GPU 224C. In an aspect of the present disclosure, the second TMI 212B or 212B' may be coupled to the plurality of solder balls 204 through a plurality of metal traces and micro-vias 228B or 228B'.

In an aspect of the present disclosure, the second TMI 212B may be adjacent to the first TMI 212A. The first portion 214 may be adjacent to the fourth portion 217. The second portion 215 may be adjacent to the third portion 216.

In an aspect of the present disclosure, the first portion 214 may have the same width as the third portion 216. The second portion 215 may have the same width as the fourth portion 217. Alternatively, the first portion 214 may have the same width as the fourth portion 217, and the second portion 215 may have the same width as the third portion 216.

In an aspect of the present disclosure, a plurality of solder bumps 220 may be disposed on the mold portion 210. The plurality of solder bumps 220 may provide an electrical connection between the at least one TMI 212, and the semiconductor device, e.g., CPU 224B, or GPU 224C. In an aspect, a first number of solder bumps 220 disposed on the second portion 215 may be higher than a second number of solder bumps 220 disposed on the third portion 216.

In an aspect of the present disclosure, the plurality of solder bumps 220 may include a plurality of power (Vcc) bumps. The plurality of power (Vcc) bumps may be coupled to the first TMI 212A through the second portion 215. In an aspect, the plurality of package bumps 206a and/or 206b may include a power (Vcc) package bump. The power (Vcc) package bump may be coupled to the first TMI 212A through the first portion 214. In an aspect, the plurality of power (Vcc) bumps and the power (Vcc) package bump may facilitate the power supply reference voltage (Vcc) connection between a power rail to the semiconductor device, e.g., CPU 224B, or GPU 224C. The power rail may be on the package substrate 202 and/or a motherboard (not shown).

In an aspect of the present disclosure, the plurality of solder bumps 220 may include a plurality of ground (Vss) bumps. The plurality of ground (Vss) bumps may be coupled to the second TMI 212B through the third portion 216. In an aspect, the plurality of package bumps 206a and/or 206b may include a ground (Vss) package bump. The ground (Vss) package bump may be coupled to the second TMI 212B through the fourth portion 217. In an aspect, the plurality of ground (Vss) bumps, and the ground (Vss) package bump may facilitate the ground reference voltage (Vss) connection between the package substrate 202 and the semiconductor device, e.g., CPU 224B, or GPU 224C.

In an aspect of the present disclosure, the complementary "T" shape structure of the first TMI 212A, and the inverted "T" (Vss) shape structure of the second TMI 212B may enhance the mutual inductance for power delivery noise reduction. In an aspect, the asymmetrical dimension of the second portion 215, and third portion 216 may allow the at least one TMI 212 to support non-uniform power (Vcc) bump and/or ground (Vss) bump configurations, for example 4 power (Vcc) bumps may be mounted on a surface of the second portion 215 compared to 2 ground (Vss) bumps mounted on a surface of the third portion 216. This may result in circuitry footprint optimization. Dedicated power delivery interconnect paths may also be ascertained through the at least one TMI 212 without traversing through the base die 208. The increased geometry of the at least one TMI 212 may also addresses the limitation of current carrying capacity imposed by the reduced geometry of the TSV through the base die 208. This may result higher system Imax capability for improved Fmax performance.

Figure 3:
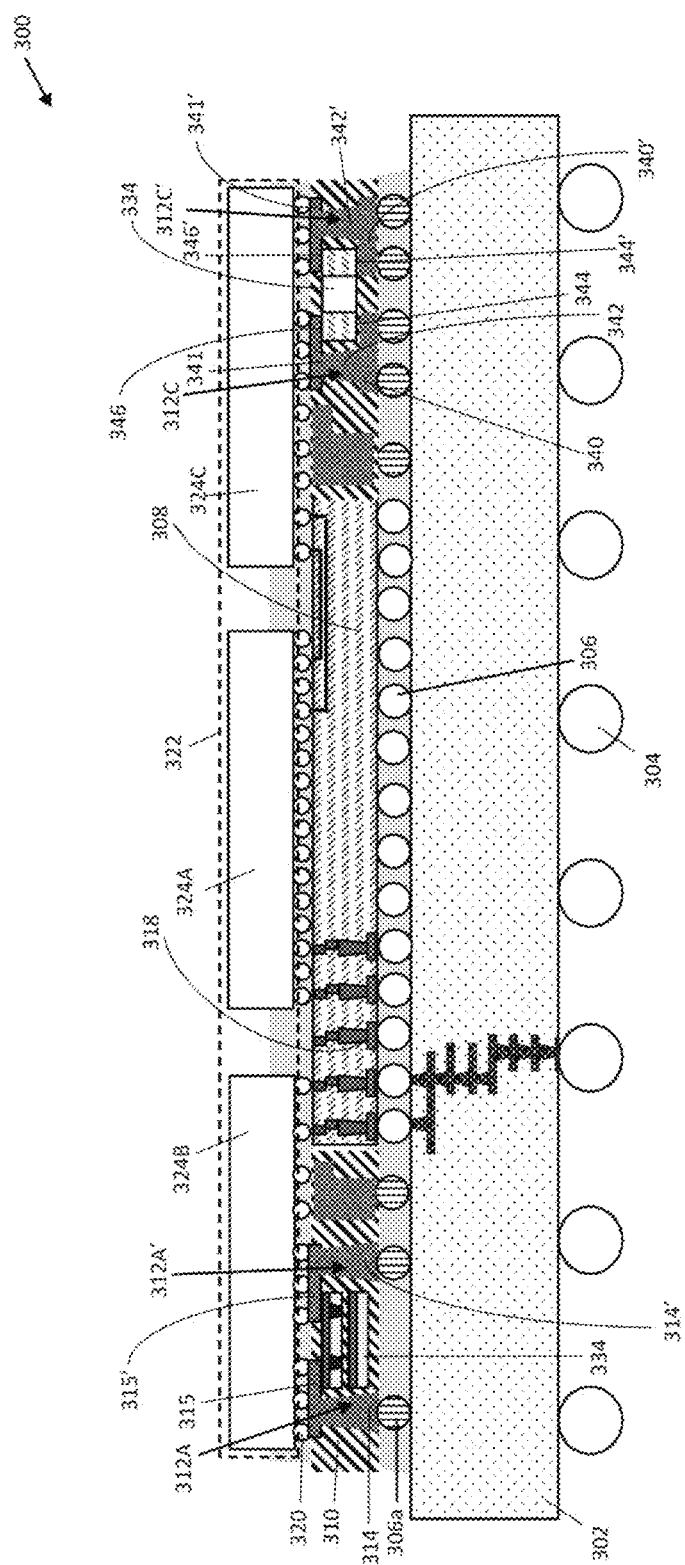
FIG. 3 shows a cross-sectional view of a stacked semiconductor package according to an aspect of the present disclosure.

FIG. 3 shows a cross-sectional view of a stacked semiconductor package according to an aspect of the present disclosure.

For the sake of brevity, duplicate descriptions of features and properties are omitted. It will be understood that the descriptions of any feature and/or property relating to FIGS. 1, 2A and 2B that are the same or similar to a feature and/or property in FIG. 3 will have those descriptions be applicable here as well.

In an aspect of the present disclosure, the stacked semiconductor package 300 may include a package substrate 302. In an aspect, the stacked semiconductor package 300 may include a plurality of solder balls 304. In an aspect, the stacked semiconductor package 300 may include a plurality of package bumps 306 and 306a disposed on the package substrate 302.

In an aspect of the present disclosure, the stacked semiconductor package 300 may include a base die 308. In an aspect, the base die 308 may be disposed on the package substrate 302. In an aspect, the base die 308 may be connected to the package substrate 302 through the plurality of package bumps 306.

In an aspect of the present disclosure, the stacked semiconductor package 300 may include a mold portion 310. In an aspect, the mold portion 310 may be disposed on the package substrate 302. In an aspect, the mold portion 310 may be connected to the package substrate 302 through the plurality of package bumps 306a. In an aspect, the mold portion 310 may be disposed at a periphery of the base die 308.

In an aspect of the present disclosure, the mold portion 310 may include at least one through-mold interconnect (TMI) 312. In an aspect, the plurality of package bumps 306a may provide an electrical connection between the at least one TMI 312, and the package substrate 302.

In an aspect of the present disclosure, the semiconductor package 300 may include a semiconductor device 322. The semiconductor device 322 may be a set of chiplets, which may include SOC 324A, CPU 324B, and GPU 324C. The semiconductor device 322 may have a first section disposed on the base die 308. The semiconductor device 322 may also have a second section disposed on the mold portion 310. In an aspect, the SOC 324A of the semiconductor device 322 may be disposed on the base die 308. The CPU 324B of the semiconductor device 322 may be partially disposed on the base die 308, and may be partially disposed on the mold portion 310. The GPU 324C of the semiconductor device 322 may be partially disposed on the base die 308, and may be partially disposed on the mold portion 310.

In an aspect, at least a portion of the semiconductor device 322 may be electrically coupled to the package substrate 302 through the at least one TMI 312.

In an aspect of the present disclosure, the at least one TMI 312 may include a first TMI 312A. In an aspect, the first TMI 312A may include a first portion 314, and a second portion 315. In an aspect, the first portion 314 may be coupled to the package substrate 302. The second portion 315 may be coupled to the semiconductor device 322.

In an aspect of the present disclosure, the first portion 314, and the second portion 315 may have different widths. The first portion 314 may have a width of a first dimension. The second portion 315 may have a width of a second dimension. In an aspect, the second dimension larger than the first dimension. In other words, the first portion 314 may have a smaller width than the second portion 315.

In an aspect of the present disclosure, the at least one TMI 312 may include an additional first TMI 312A'. The additional first TMI 312A' may be adjacent to the first TMI 312A. In an aspect, the additional first TMI 312A' may include an additional first portion 314', and an additional second portion 315'. In an aspect, the additional first portion 314' may be coupled to the package substrate 302. The additional second portion 315' may be coupled to the semiconductor device 322.

In an aspect of the present disclosure, a ledge may be formed between the first TMI 312A and the additional first TMI 312A'. In an aspect, one or more passive components 334, may be disposed between the first TMI 312A, and the additional first TMI 312A'. The one or more passive components may include a capacitor such as a silicon capacitor or a ceramic capacitor such as a multi-layer ceramic capacitor (MLCC), a resistor, a diode or an inductor. The one or more passive components 334 may be disposed on the ledge. In an aspect, the one of more passive components may be used for improving power integrity of the stacked semiconductor package 300. In an aspect, a first terminal of the one or more passive components 334 may be electrically coupled to the second portion 315. A second terminal of the one or more passive components 334 may be electrically coupled to the additional second portion 315'. This may result in AC noise reduction as the proximity of a decoupling passive component to the semiconductor device 322 may reduce power supply induced jitter, which may lead to electrical performance improvements.

In an aspect of the present disclosure, the at least one TMI 312 may include a third TMI 312C. In an aspect, the third TMI 312C may include a fifth portion 340, and a sixth portion 341. In an aspect, the sixth portion 341 may be coupled to the semiconductor device 322. The fifth portion 340 may be coupled to the package substrate 302. In an aspect, the fifth portion 340, and the sixth portion 341 may have different widths. A width of the fifth portion 340 may be smaller than a width of the sixth portion 341. Alternatively, the fifth portion 340, and the sixth portion 341 may have a substantially similar width.

In an aspect of the present disclosure, the third TMI 312C may include an intermedial portion 342. The intermedial portion 342 may be disposed between the fifth portion 340, and the sixth portion 341. The intermedial portion 342 may connect the fifth portion 340, and the sixth portion 341. In an aspect, the intermedial portion 342 may have a smaller width than both of the fifth portion 340 and the sixth portion 341. In an aspect, a first ledge 344 may be established at the junction of the fifth portion 340, and the intermedial portion 342. In an aspect, a second ledge 346 may be established at the junction of the sixth portion 341, and the intermedial portion 342.

In an aspect of the present disclosure, the at least one TMI 312 may include an additional third TMI 312C'. In an aspect, the additional third TMI 312C' may be adjacent to the third TMI 312C. In an aspect, the additional third TMI 312C' may include an additional fifth portion 340', and an additional sixth portion 341'. In an aspect, the additional sixth portion 341' may be coupled to the semiconductor device 322. The additional fifth portion 340' may be coupled to the package substrate 302. In an aspect, the additional fifth portion 340', and the additional sixth portion 341' may have different widths. A width of the additional fifth portion 340' may be smaller than a width of the additional sixth portion 341'. Alternatively, the additional fifth portion 340', and the additional sixth portion 341' may have a substantially similar width.

In an aspect of the present disclosure, the additional third TMI 312C' may include an additional intermedial portion 342'. The additional intermedial portion 342' may be disposed between the additional fifth portion 340', and the additional sixth portion 341'. The additional intermedial portion 342' may connect the additional fifth portion 340', and the additional sixth portion 341'. In an aspect, the additional intermedial portion 342' may have a smaller width than both of the additional fifth portion 340', and the additional sixth portion 341'. In an aspect, an additional first ledge 344' may be established at the junction of the additional fifth portion 340', and the additional intermedial portion 342'. In an aspect, an additional second ledge 346' may be established at the junction of the additional sixth portion 341', and the additional intermedial portion 342'.

In an aspect of the present disclosure, one or more passive components 334 may be disposed between the third TMI 312C, and the additional third TMI 312C'. In an aspect, the one or more passive components may be used for improving power integrity of the stacked semiconductor package 300. The one or more passive components 334 may be may include a capacitor such as a silicon capacitor or a ceramic capacitor such as a multi-layer ceramic capacitor (MLCC), a resistor, a diode or an inductor. In an aspect, a first terminal of the one or more passive components 334 may be electrically coupled to the first ledge 344, or the second ledge 346. In an aspect, a second terminal of the one or more passive components 334 may be electrically coupled to the additional first ledge 344', or the additional second ledge 346'. This may result in AC noise reduction as the proximity of a decoupling passive component to the semiconductor device 322 may reduce power supply induced jitter, which may lead to electrical performance improvements.

FIGS. 4A through 4I show cross-sectional views directed to an exemplary process flow for a method of forming a stacked semiconductor package according to an aspect of the present disclosure.

As shown in FIG. 4A, a seeding layer 452 may be disposed on a carrier 450. The seeding layer may be made from copper. In an aspect, the seeding layer 452 may include an adhesive layer, for example, a polyimide adhesive layer. A metal layer 454 may be disposed on the seeding layer 452. The metal layer 454 may be made of copper, silver or aluminum. The metal layer 454 may be disposed on the sedding layer 452 through a lamination and/or an electroplating process.

As shown in FIG. 4B, an etching process such as dry etching or wet etching may be used to remove a portion of the metal layer 454 to obtain metal pads 456.

As shown in FIG. 4C, a base die 408 may be disposed on the carrier 450 and/or the seeding layer 452 using thermal bonding and/or a mechanical attachment process. A plurality of TSVs 418 may be pre-formed in the base die 408 before the base die 408 is disposed on the carrier 450 and/or the seeding layer 452. The base die 408 may be an active or passive silicon interposer. Passive components 434A, and 434B may be formed on the metal pads 456 using thermal bonding, and/or a solder reflow process. The passive components 434A and 434B may be a ceramic capacitor or a silicon capacitor. In an aspect of the present disclosure, the passive component 434B, may be a silicon capacitor which may include a vertical stacked capacitor configuration.

As shown in FIG. 4D, a mold layer 410 may be formed over the components. The mold layer 410 may be formed through compression, injection and/or by a transfer molding process. A plurality of via openings 458 may be formed in the mold layer 410 using a laser.

As shown in FIG. 4E, a plurality of second via openings 460 may be formed in the mold layer 410 near the plurality of via openings 458 using a laser.

Figure 4F:
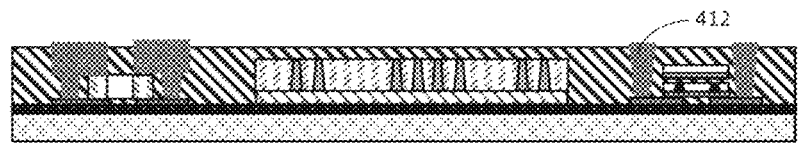

As shown in FIG. 4F, a conductive material may be disposed in the plurality of via openings 458, and the plurality of second via openings 460 to form a plurality of TMIs 412. The conductive material may be disposed using an electroless and/or electroplating process.

Figure 4G:
Figure 4G:
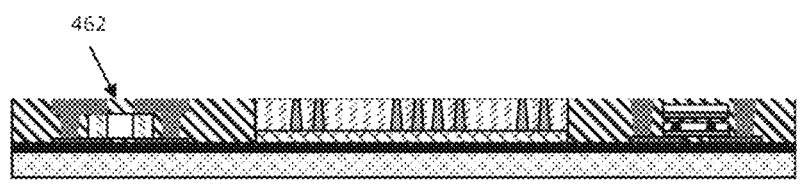

As shown in FIG. 4G, the excess mold layer 410, and TMIs 412 are removed using a mechanical grinding and/or an etching process to obtain a planar surface. A molded interposer 462 may be formed. The molded interposer 462 may be a single component/structure including an integrated base die 408, and the mold portion 410 with TMI 412.

Figure 4H:
Figure 4H:
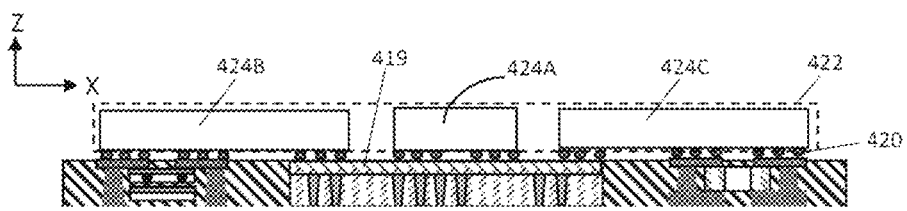

As shown in FIG. 4H, the carrier 450 and the seeding layer 452 may be removed using a mechanical grinding, etching or laser process. The device may then be flipped over. A plurality of solder bumps 420 may be disposed on the flipped device, on the mold layer 410 (i.e. on the TMIs 412) and the base die 408 (i.e. on RDL 419). A semiconductor device 422 may be disposed on the plurality of solder bumps 420. The semiconductor device 422 may include a set of chiplets 424A, 424B, and 424C.

Figure 4I:
Figure 4I:
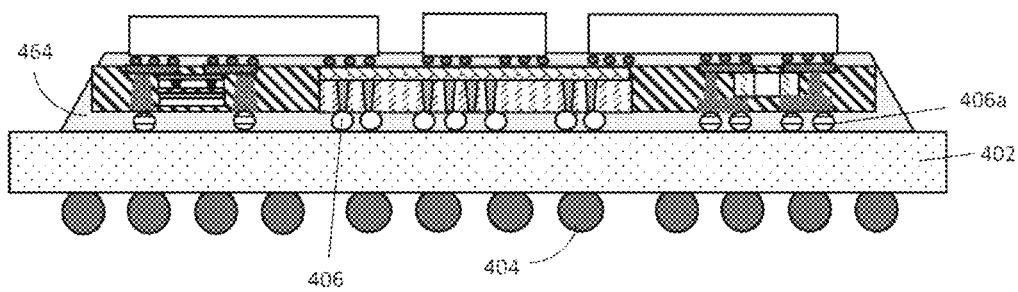

In FIG. 4I, a package substrate 402 may be prepared according to conventional methods. The package substrate 402 may be coupled to the device of FIG. 4H by package bumps 406 and 406a. The package substrate 402 may have solder balls 404 on the opposing surface for connection to a motherboard. In addition, an underfill 464 may be provided using either a conventional underfilling process and/or no-flow underfilling process to reduce the effects of thermal expansion.

It will be understood that the exemplary process described above relating to FIGS. 4A through 4I are not limited to this particular order. Any suitable, modified order of operations may be used.

Figure 5:
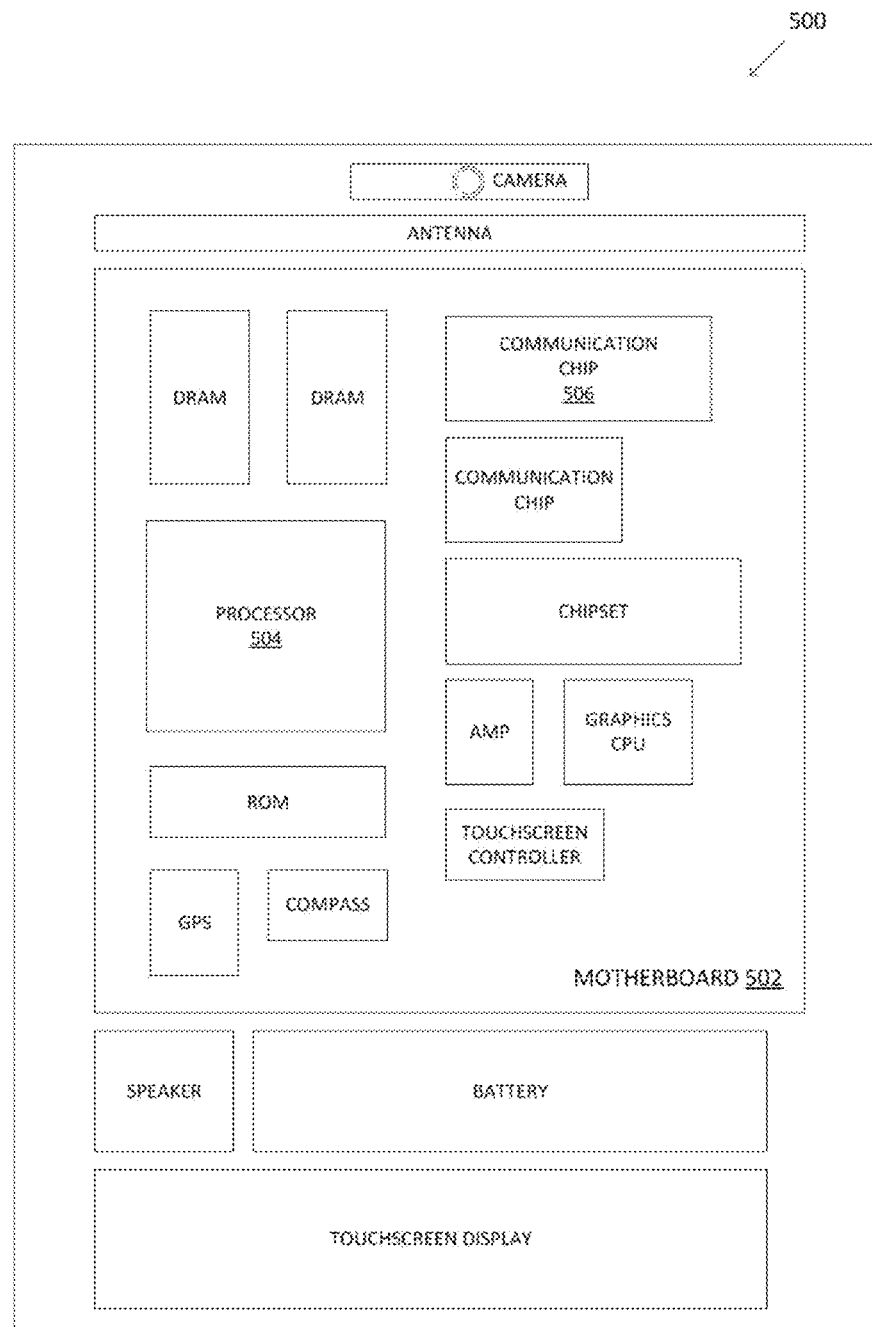
FIG. 5 shows an illustration of a computing device that includes a stacked semiconductor package according to a further aspect of the present disclosure.

Aspects of the present disclosure may be implemented into a system using any suitable hardware and/or software. FIG. 5 schematically illustrates a computing device 500 that may include a stacked semiconductor package as described herein, in accordance with some aspects. The computing device 500 may house a board such as motherboard 502. The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the processor 504 of the computing device 500 may be packaged in a stacked semiconductor package, as described herein, and/or other semiconductor devices may be packaged together in a stacked semiconductor package as described herein.

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 506 may implement any of a number of wireless standards or protocols, including but not limited to Institute for Electrical and Electronic Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 506 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other aspects.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an aspect, the computing device 500 may be a mobile computing device. In further implementations, the computing device 500 may be any other electronic device that processes data.

Figure 6:
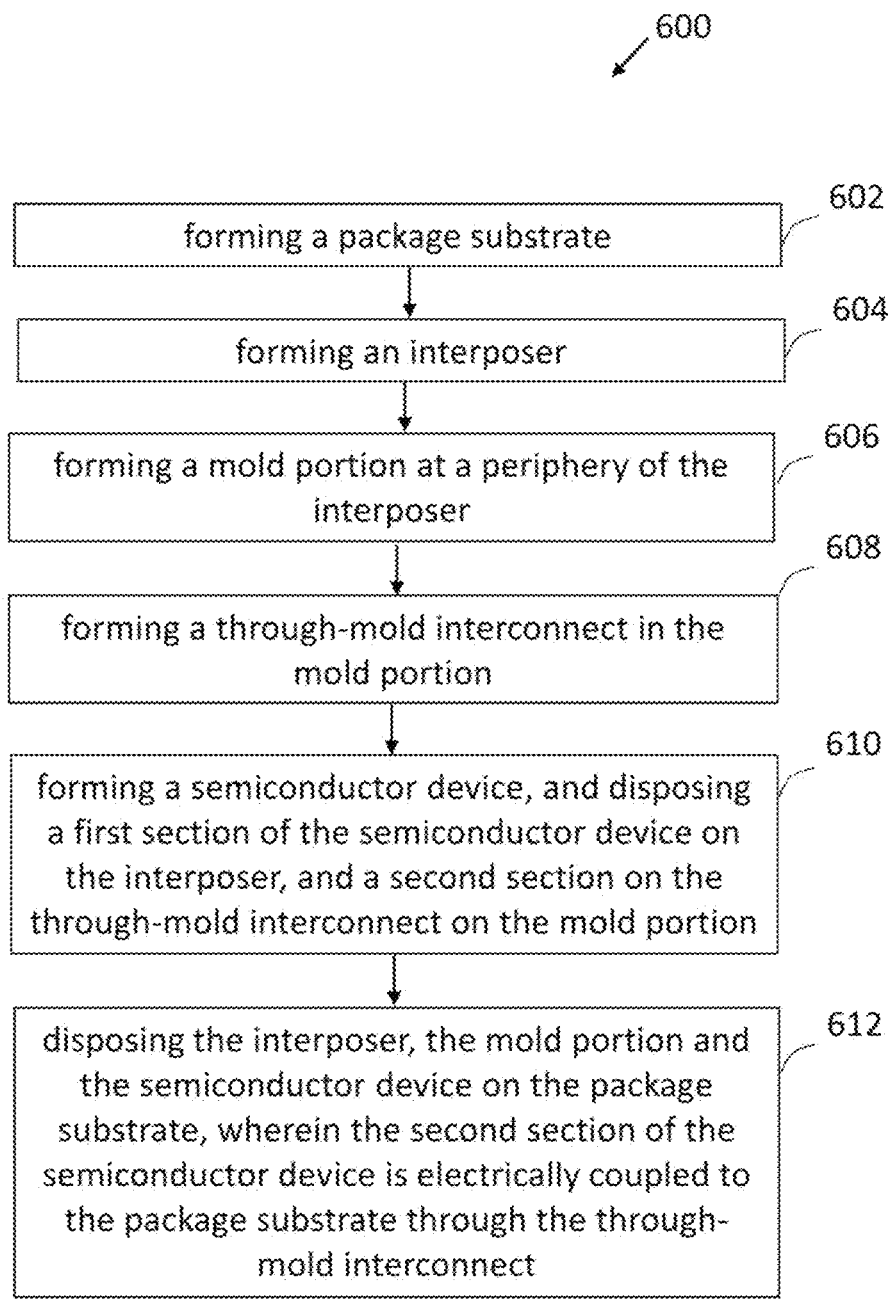
FIG. 6 shows a flow chart illustrating a method of forming a stacked semiconductor package according to an aspect of the present disclosure.

FIG. 6 shows a flow chart illustrating a method of forming a stacked semiconductor package according to an aspect of the present disclosure.

As shown in FIG. 6, a first operation 602 of the method 600 of forming a stacked semiconductor package may include forming a package substrate. In a second operation 604, an interposer (e.g., a base die) may be formed. In a third operation 606, a mold portion may be formed at a periphery of the interposer. In a fourth operation 608, a through-mold interconnect may be formed in the mold portion. In a fifth operation 610, a semiconductor device may be formed. A first section of the semiconductor device may be disposed on the interposer, and a second section may be disposed on the through-mold interconnect on the mold portion. In a sixth operation 612, the interposer, the mold portion, and the semiconductor device may be disposed on the package substrate. The second section of the semiconductor device may be electrically coupled to the package substrate through the through-mold interconnect.

It will be understood that the above operations described above relating to FIG. 6 are not limited to this particular order. Any suitable, modified order of operations may be used.

EXAMPLES

Example 1 may include a device including: a package substrate; a base die on and electrically coupled to the package substrate; a mold portion on the package substrate at a periphery of the base die, the mold portion including a through-mold interconnect electrically coupled to the package substrate; a semiconductor device having a first section disposed on the base die and a second section disposed on the mold portion; and in which the second section of the semiconductor device is electrically coupled to the package substrate through the through-mold interconnect.

Example 2 may include the device of example 1, and/or any other example disclosed herein in which the through-mold interconnect further includes: a first portion coupled to the package substrate; and a second portion coupled to the semiconductor device, in which the first portion and the second portion have different widths.

Example 3 may include the device of example 2, and/or any other example disclosed herein, further including the first portion having a smaller width than the second portion for power supply voltage (Vcc) connection between the package substrate and the semiconductor device.

Example 4 may include the device of example 2, and/or any other example disclosed herein, further including the first portion having a larger width than the second portion for ground reference voltage (Vss) connection between the package substrate and the semiconductor device.

Example 5 may include the device of example 2, and/or any other example disclosed herein, in which the through-mold interconnect further includes: an intermedial portion being disposed between the first portion and the second portion; and the intermedial portion having a smaller width than both of the first portion and the second portion.

Example 6 may include the device of example 2, and/or any other example disclosed herein, in which the mold portion further includes: a second through-mold interconnect adjacent to the through-mold interconnect, the second through-mold interconnect having a third portion coupled to the semiconductor device, and a fourth portion coupled to the package substrate, in which the third portion and the fourth portion have different widths.

Example 7 may include the device of example 6, and/or any other example disclosed herein, further including: the first portion having a smaller width than the second portion for power supply voltage (Vcc) connection between the package substrate and the semiconductor device; and the fourth portion having a larger width than the third portion, for ground reference voltage (Vss) connection between the package substrate and the semiconductor device.

Example 8 may include the device of example 6, and/or any other example disclosed herein, further including a plurality of solder bumps disposed on the second and third portions, in which a first number of solder bumps disposed on the second portion is higher than a second number of solder bumps disposed on the third portion.

Example 9 may include the device of example 6, and/or any other example disclosed herein, further including: the through-mold interconnect having a first intermedial portion disposed between the first portion and the second portion, the first intermedial portion having a smaller width than the first and second portions; and the second through-mold interconnect having a second intermedial portion disposed between the third portion and the fourth portion, the second intermedial portion having a smaller width than the third and fourth portions, wherein a ledge is formed between the through-mold interconnect and the second through-mold interconnect.

Example 10 may include the device of example 9, and/or any other example disclosed herein, in which the mold portion further includes one or more passive components disposed on the ledge formed between the through-mold interconnect and the second through-mold interconnect.

Example 11 may include the device of example 1, and/or any other example disclosed herein, in which the base die includes a through-silicon via configured to transmit signals between the semiconductor device and the package substrate.

Example 12 may include the device of example 11, and/or any other example disclosed herein, further including the through-silicon via having dimensions that provide a smaller volume than a volume of the through-mold interconnect.

Example 13 may include a method of forming a stacked semiconductor package including: forming a package substrate; forming an interposer; forming a mold portion at a periphery of the interposer; forming a through-mold interconnect in the mold portion; forming a semiconductor device and disposing a first section of the semiconductor device on the interposer and a second section on the through-mold interconnect on the mold portion; disposing the interposer, the mold portion and the semiconductor device on the package substrate, in which the second section of the semiconductor device is electrically coupled to the package substrate through the through-mold interconnect.

Example 14 may include the method of example 13, and/or any other example disclosed herein, in which forming the through-mold interconnect further includes: forming a first portion having a first width on the package substrate; and forming a second portion having a second width on the first portion, in which the second portion is coupled to the semiconductor device.

Example 15 may include the method of example 14, and/or any other example disclosed herein, in which the first portion and the second portion have different dimensions that provide substantially similar volumes.

Example 16 may include the method of example 13, and/or any other example disclosed herein, further including: forming a second through-mold interconnect having a third portion coupled to the semiconductor device and a fourth portion coupled to the package substrate, in which the second through-mold interconnect is positioned adjacent to the through-mold interconnect in the mold portion, and in which the third portion and the fourth portion have different widths.

Example 17 may include the method of example 16, and/or any other example disclosed herein, in which forming the through-mold interconnect further includes: forming a first intermedial portion between the first portion and the second portion, in which the intermedial portion has a smaller width than both of the first portion and the second portion; and forming a second intermedial portion between the third portion and the fourth portion, in which the second intermedial portion has a smaller width than both of the third portion and the fourth portion.

Example 18 may include the method of example 17, and/or any other example disclosed herein, further including disposing one or more passive components on a ledge formed between the through-mold interconnect and the second through-mold interconnect adjacent to the first and second intermedial portions.

Example 19 may include a computing device including: a circuit board; a stacked semiconductor package coupled with the circuit board, the semiconductor package including: a package substrate; a base die on and electrically coupled to the package substrate; a mold portion on the package substrate at a periphery of the base die, the mold portion including a through-mold interconnect electrically coupled to the package substrate; a semiconductor device having a first section disposed on the base die and a second section disposed on the mold portion; and in which the second section of the semiconductor device is electrically coupled to the package substrate through the through-mold interconnect.

Example 20 may include the computing device of example 19, and/or any other example disclosed herein, in which the through-mold interconnect includes a first portion coupled to the package substrate, and a second portion coupled to the semiconductor device; and in which the first portion and the second portion have different widths.

These and other advantages and features of the aspects herein disclosed will be apparent through reference to the following description and the accompanying drawings. Furthermore, it is to be understood that the features of the various aspects described herein are not mutually exclusive and can exist in various combinations and permutations.

It will be understood that any property described herein for a specific system or package may also hold for any system or package described herein. It will also be understood that any property described herein for a specific method may hold for any of the methods described herein. Furthermore, it will be understood that for any package, system, or method described herein, not necessarily all the components or operations described will be enclosed in the package, system, or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A device comprising:
    a package substrate;
    a base die on and electrically coupled to the package substrate;
    a mold portion on the package substrate at a periphery of the base die, the mold portion comprising a through-mold interconnect electrically coupled to the package substrate;
    a semiconductor device having a first section disposed on the base die and a second section disposed on the mold portion; and
    wherein the second section of the semiconductor device is electrically coupled to the package substrate through the through-mold interconnect;
    wherein the through-mold interconnect further comprises:
    a first portion coupled to the package substrate; and
    a second portion coupled to the semiconductor device, wherein the first portion and the second portion have different widths;
    wherein the mold portion further comprises:
        a second through-mold interconnect adjacent to the through-mold interconnect, the second through-mold interconnect having a third portion coupled to the semiconductor device, and a fourth portion coupled to the package substrate, wherein the third portion and the fourth portion have different widths;
        further comprising a plurality of solder bumps disposed on the second and third portions, wherein a first number of solder bumps disposed on the second portion is higher than a second number of solder bumps disposed on the third portion.

2. The device of claim 1, further comprising the first portion having a smaller width than the second portion for power supply voltage (Vcc) connection between the package substrate and the semiconductor device.

3. The device of claim 1, further comprising the first portion having a larger width than the second portion for ground reference voltage (Vss) connection between the package substrate and the semiconductor device.

4. The device of claim 1,
    wherein the through-mold interconnect further comprises:
    an intermedial portion being disposed between the first portion and the second portion; and
    the intermedial portion having a smaller width than both of the first portion and the second portion.

5. The device of claim 1, further comprising:
    the first portion having a smaller width than the second portion for power supply voltage (Vcc) connection between the package substrate and the semiconductor device; and
    the fourth portion having a larger width than the third portion, for ground reference voltage (Vss) connection between the package substrate and the semiconductor device.

6. The device of claim 1, wherein the mold portion further comprises one or more passive components disposed on the ledge formed between the through-mold interconnect and the second through-mold interconnect.

7. The device of claim 1, wherein the base die comprises a through-silicon via configured to transmit signals between the semiconductor device and the package substrate.

8. The device of claim 7, further comprising the through-silicon via having dimensions that provide a smaller volume than a volume of the through-mold interconnect.

9. A method of forming a stacked semiconductor package comprising:
    forming a package substrate;
    forming an interposer;
    forming a mold portion at a periphery of the interposer;
    forming a through-mold interconnect in the mold portion;

forming a semiconductor device and disposing a first section of the semiconductor device on the interposer and a second section on the through-mold interconnect on the mold portion;

disposing the interposer, the mold portion and the semiconductor device on the package substrate, wherein the second section of the semiconductor device is electrically coupled to the package substrate through the through-mold interconnect;

forming a first portion having a first width on the package substrate; and forming a second portion having a second width on the first portion, wherein the second portion is coupled to the semiconductor device;

wherein the first portion and the second portion have different dimensions that provide substantially similar volumes;

forming a second through-mold interconnect having a third portion coupled to the semiconductor device and a fourth portion coupled to the package substrate, wherein the second through-mold interconnect is positioned adjacent to the through-mold interconnect in the mold portion, and wherein the third portion and the fourth portion have different widths;

further comprising disposing a plurality of solder bumps on the second and third portions, wherein a first number of solder bumps disposed on the second portion is higher than a second number of solder bumps disposed on the third portion.

10. The method of claim 9, wherein forming the through-mold interconnect further comprises:

forming a first intermedial portion between the first portion and the second portion, wherein the intermedial portion has a smaller width than both of the first portion and the second portion; and forming a second intermedial portion between the third portion and the fourth portion, wherein the second intermedial portion has a smaller width than both of the third portion and the fourth portion.

11. The method of claim 10, further comprising disposing one or more passive components on a ledge formed between the through-mold interconnect and the second through-mold interconnect adjacent to the first and second intermedial portions.

12. The method of claim 9, further comprising forming within the mold portion one or more passive components disposed on the ledge formed between the through-mold interconnect and the second through-mold interconnect.

13. A computing device comprising:

a circuit board;

a stacked semiconductor package coupled with the circuit board, the semiconductor package comprising:

a package substrate;

a base die on and electrically coupled to the package substrate;

a mold portion on the package substrate at a periphery of the base die, the mold portion comprising a through-mold interconnect electrically coupled to the package substrate;

a semiconductor device having a first section disposed on the base die and a second section disposed on the mold portion; and wherein the second section of the semiconductor device is electrically coupled to the package substrate through the through-mold interconnect;

wherein the through-mold interconnect further comprises:

a first portion coupled to the package substrate; and a second portion coupled to the semiconductor device, wherein the first portion and the second portion have different widths;

wherein the mold portion further comprises:

a second through-mold interconnect adjacent to the through-mold interconnect, the second through-mold interconnect having a third portion coupled to the semiconductor device, and a fourth portion coupled to the package substrate, wherein the third portion and the fourth portion have different widths;

further comprising a plurality of solder bumps disposed on the second and third portions, wherein a first number of solder bumps disposed on the second portion is higher than a second number of solder bumps disposed on the third portion.

14. The device of claim 13, wherein the mold portion further comprises one or more passive components disposed on the ledge formed between the through-mold interconnect and the second through-mold interconnect.

* * * * *